(12) United States Patent  
Niki et al.

(10) Patent No.: US 7,622,993 B2
(45) Date of Patent: Nov. 24, 2009

(54) CURRENT MIRROR CIRCUIT

(75) Inventors: Yoshiki Niki, Oota (JP); Haruo Kobayashi, Kiryu (JP); Koichiro Mashiko, Takaraduka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 12/189,044

(22) Filed: Aug. 8, 2008

(65) Prior Publication Data

US 2008/0297203 A1   Dec. 4, 2008

Related U.S. Application Data

(62) Division of application No. 11/370,630, filed on Mar. 8, 2006, now Pat. No. 7,425,870.

(30) Foreign Application Priority Data

Mar. 10, 2005   (JP) .............................. 2005-068179

(51) Int. Cl.
  *H03F 3/04*   (2006.01)
(52) U.S. Cl. ...................................... 330/288; 323/315
(58) Field of Classification Search ................. 330/288; 323/315, 316
  See application file for complete search history.

(56) References Cited

U.S. PATENT DOCUMENTS 5,986,507 A * 11/1999 Itakura et al. ............... 330/288
6,064,267 A * 5/2000 Lewyn ........................ 330/288
6,194,967 B1 * 2/2001 Johnson et al. ............. 330/288
6,587,000 B2 * 7/2003 Oikawa ....................... 330/288

FOREIGN PATENT DOCUMENTS

JP     11-214934 A     8/1999
JP    2000-114891 A    4/2000

OTHER PUBLICATIONS

Charlon, O., and W. Redman-White, "Ultra High-Compliance CMOS Current Mirrors for Low Voltage Charge Pumps and References," Proceedings of the 30th European Solid-State Circuits Conference, Leuven, Belgium, Sep. 21-23, pp. 227-230.

* cited by examiner

*Primary Examiner*—Henry K Choe
(74) *Attorney, Agent, or Firm*—Christensen O'Connor Johnson Kindness PLLC (57) ABSTRACT

A current mirror circuit including: a first resistance element having one terminal connected to a first potential, and the other terminal connected to a second potential lower than the first potential; an operational amplifier having a high-potential input terminal connected to the first potential and the one terminal of the first resistance element; a second resistance element having one terminal connected to a low-potential input terminal of the operational amplifier, and the other terminal connected to the second potential; and a transistor having a first electrode connected to an output terminal of the operational amplifier, a second electrode connected to the low-potential input terminal of the operational amplifier and the one terminal of the second resistance element, and a third electrode used as an output terminal, wherein the first and second resistance elements both start to operate from a linear area having lower voltage than a saturation area.

8 Claims, 11 Drawing Sheets

CURRENT MIRROR CIRCUIT

CROSS-REFERENCE TO RELATED APPLICATIONS

This application is based upon and claims the benefit of priority from prior Japanese Patent Application No. 2005-068179, filed Mar. 10, 2005, the entire contents of which are incorporated herein by reference.

BACKGROUND OF THE INVENTION

1. Field of the Invention

The present invention relates to a current mirror circuit. In particular, the present invention relates to a current mirror circuit having an operating voltage area broadened to a low voltage side.

2. Description of the Related Art

Of current mirror circuits, for example, a current mirror circuit using a MOSFET makes the following settings. That is, it is general to use the MOSFET in a saturation area. However, according to the foregoing settings, the minimum allowable voltage of output voltage is high; for this reason, it is difficult to achieve low voltage with scale-down. In recent years, there has been developed a technique of reducing the minimum allowable voltage of output voltage to operate a current mirror circuit at lower voltage. Specifically, some current mirror circuits using a linear area of MSFET have been proposed. The technique is disclosed in the following document, for example.

Document: O. Charlon, W. Redman-White, "UltraHigh-Compliance CMOS Current Mirrors for Low Voltage Charge Pumps and References", Proc. Of ESSCIRC 04, pp. 227-230, Leuven (September 2004)

However, even if the current mirror circuit disclosed in the foregoing document is employed, it is difficult to sufficiently satisfy low voltage requirements under the process rules less than 1.5 µm rule.

BRIEF SUMMARY OF THE INVENTION

According to an aspect of the present invention, there is provided a current mirror circuit comprising:

a first transistor having a first electrode connected to a first potential, a second electrode connected to a second potential lower than the first potential, and a third electrode connected to a third potential higher than the second potential;

a second transistor having a first electrode connected to the first potential and the first electrode of the first transistor, and a second electrode connected to the second potential;

an operational amplifier having a high-potential input terminal connected to the third potential and the third electrode of the first transistor, and a low-potential input terminal connected to the third electrode of the second transistor; and a third transistor having a first electrode connected to an output terminal of the operational amplifier, a second electrode connected low-potential input terminal of the operational amplifier and the third electrode of the second transistor, and a third electrode used as an output terminal.

According to another aspect of the present invention, there is provided a current mirror circuit comprising:

a first resistance element having one terminal connected to a first potential, and the other terminal connected to a second potential lower than the first potential;

an operational amplifier having a high-potential input terminal connected to the first potential and the one terminal of the first resistance element;

a second resistance element having one terminal connected to a low-potential input terminal of the operational amplifier, and the other terminal connected to the second potential; and a transistor having a first electrode connected to an output terminal of the operational amplifier, a second electrode connected to the low-potential input terminal of the operational amplifier and the one terminal of the second resistance element, and a third electrode used as an output terminal, wherein the first resistance element and the second resistance element both start to operate from a linear area having lower voltage than a saturation area.

According to another aspect of the present invention, there is provided a current mirror circuit comprising:

a first transistor having a first electrode connected to a first potential, and a second electrode connected to a second potential lower than the first potential;

a second transistor having a first electrode connected to the first potential and the first electrode of the first transistor, and a second electrode connected to the second potential;

an operational amplifier having a high-potential input terminal connected to the third electrode of the first transistor, and a low-potential input terminal connected to the third electrode of the second transistor;

a third transistor having a first electrode connected to an output terminal of the operational amplifier, a second electrode connected to the low-potential input terminal of the operational amplifier and the third electrode of the second transistor, and a third electrode used as an output terminal; and a fourth transistor having a first electrode connected to the second potential, a second electrode connected to the first potential and connected to the first electrode of the first transistor and the first electrode of the second transistor, and a third electrode connected to the high-potential input terminal of the operational amplifier and the third electrode of the first transistor.

According to yet another aspect of the present invention, there is provided a current mirror circuit comprising:

first and second NMOS transistors each having gate and source connected to the same potential, and operating in a linear area;

a third NMOS transistor connected in series to the second NMOS transistor, and having one terminal connected to an output terminal; and a control circuit controlling a gate voltage value of the third NMOS transistor to equalize drain voltage values of the first and second NMOS transistors.

According to still another aspect of the present invention, there is provided A current mirror circuit comprising:

first and second PMOS transistors each having gate and source connected to the same potential, and operating in a linear area;

a third PMOS transistor connected in series to the second PMOS transistor, and having one terminal connected to an output terminal; and a control circuit controlling a gate voltage value of the third PMOS transistor to equalize drain voltage values of the first and second PMOS transistors.

DETAILED DESCRIPTION OF THE INVENTION

Embodiments of the present invention will be described below with reference to the accompanying drawings.

First Embodiment

Figure 1:
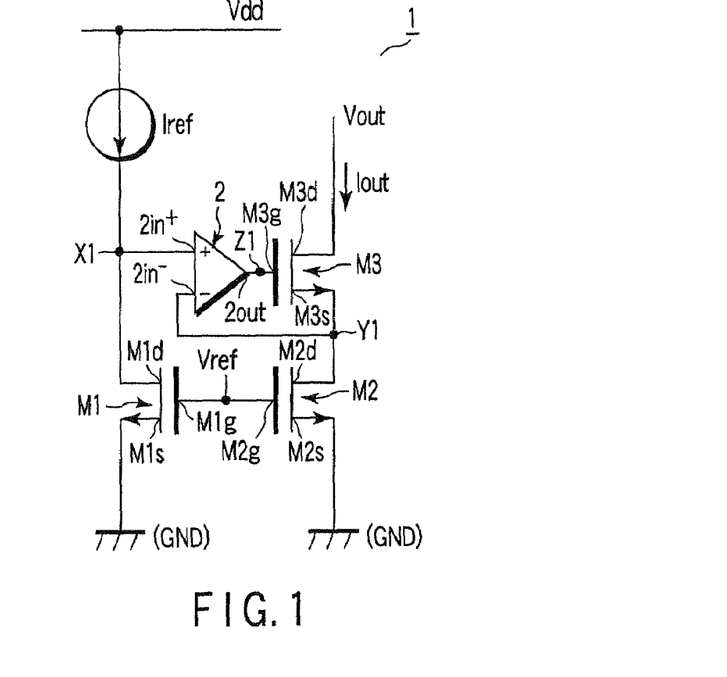
FIG. 1 is a circuit diagram showing the configuration of a current mirror circuit according to a first embodiment of the present invention.
Figure 2:
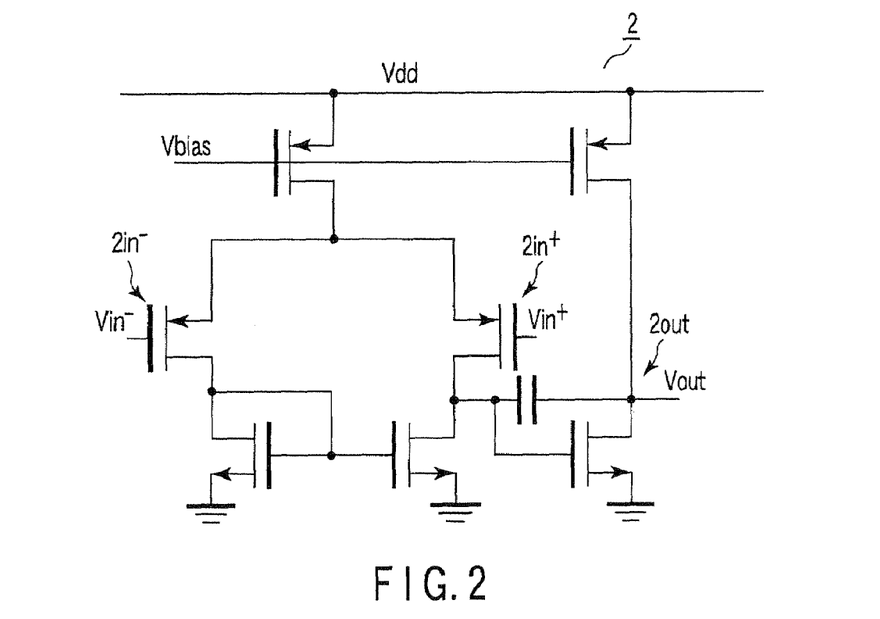
FIG. 2 is a circuit diagram showing the configuration of an operational amplifier used for operating simulation of the current mirror circuit shown in FIG. 1.
Figure 3:
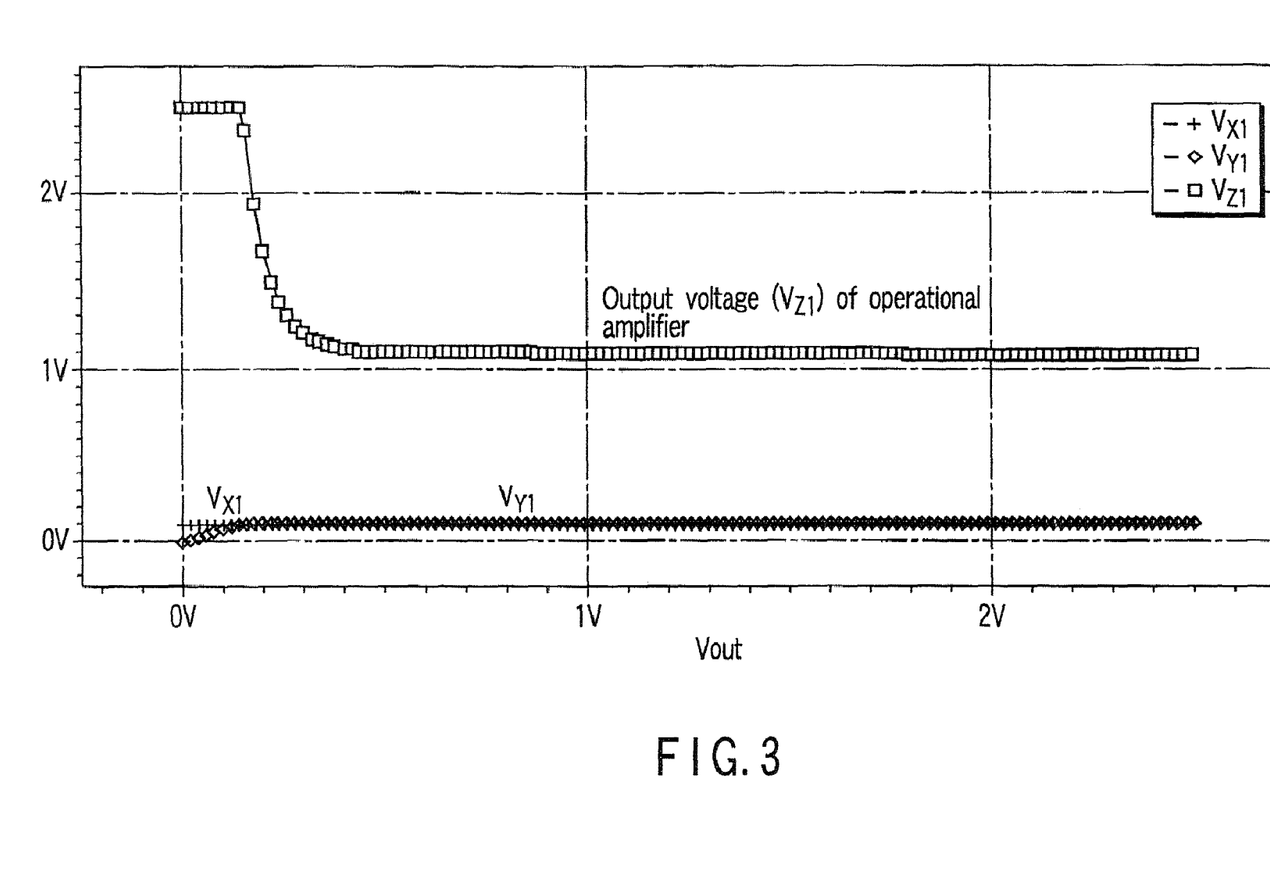
FIG. 3 is a graph showing voltage values X1, Y1 and Z1 shown in FIG. 1.
Figure 4:
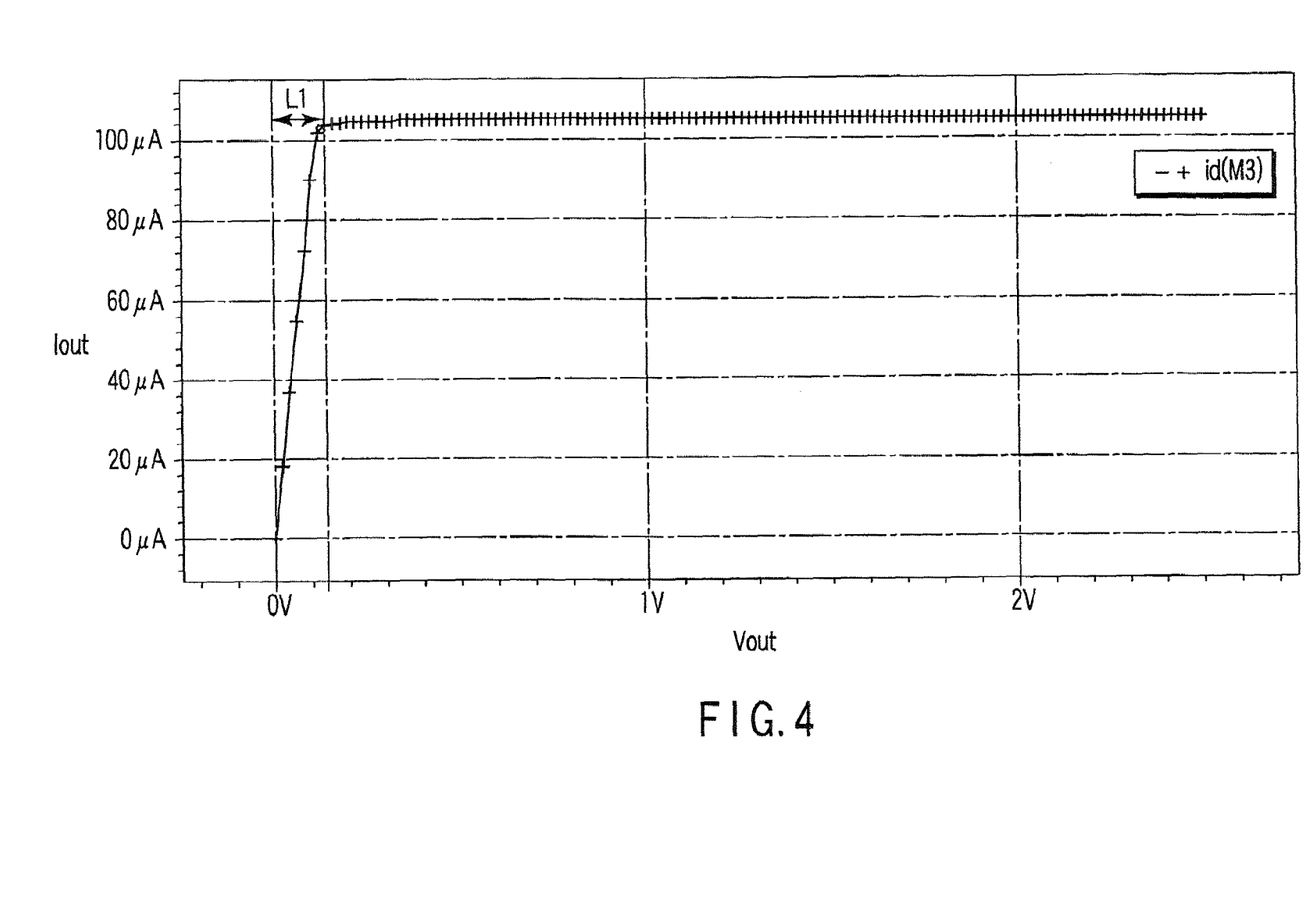
FIG. 4 is a graph showing output current characteristic with respect to output voltage of the current mirror circuit shown in FIG. 1.

The first embodiment of the present invention will be explained below with reference to FIG. 1 to FIG. 4. FIG. 1 is a circuit diagram showing the configuration of a current mirror circuit according to a first embodiment of the present invention. FIG. 2 is a circuit diagram showing the configuration of an operational amplifier used for operating simulation of the current mirror circuit shown in FIG. 1. FIG. 3 is a graph showing voltage values X1, Y1 and Z1 shown in FIG. 1. FIG. 4 is a graph showing output current characteristic with respect to output voltage of the current mirror circuit shown in FIG. 1.

As shown in FIG. 1, a current mirror circuit 1 of the first embodiment is composed of first to third transistors M1 to M3 and one operational amplifier 2. These first to third transistors M1 to M3 are each an NMOS transistor.

A gate electrode M1g functioning as a first electrode of the first NMOS transistor M1 is electrically connected to a reference potential (voltage) Vref as a first potential higher than the conventional case. Moreover, a source electrode M1s functioning as a second electrode of the first NMOS transistor M1 is electrically connected to a second potential lower than the first potential. Specifically, the source electrode M1s of the first NMOS transistor M1 is grounded. A drain electrode M1d functioning as a third electrode of the first NMOS transistor M1 is electrically connected to a third potential higher than the second potential. Specifically, the drain electrode M1d of the first NMOS transistor M1 is electrically connected to power supply potential Vdd. More specifically, the drain electrode M1d of the first NMOS transistor M1 is supplied with power supply potential Vdd via a power-supply stabilizer circuit, as seen from FIG. 1. In addition, the drain electrode M1d of the first NMOS transistor M1 is electrically connected to an input terminal 2in+ of a high potential side (+ side) of the operational amplifier 2 described later.

A gate electrode M2g functioning as a first electrode of the second NMOS transistor M2 is electrically connected to a reference potential (voltage) Vref as a first potential higher than the conventional case. Moreover, the gate electrode M2g of the second NMOS transistor M2 is electrically connected to the gate electrode M1g of the first NMOS transistors M1. Moreover, a source electrode M2s functioning as a second electrode of the second NMOS transistor M2 is electrically connected to a second potential lower than the first potential. Specifically, the source electrode M2s of the second NMOS transistor M2 is grounded. A drain electrode M2d functioning as a third electrode of the second NMOS transistor M2 is electrically connected to a source electrode M3s functioning as a second electrode of the third NMOS transistor M3 described later. In addition, the drain electrode M2d of the second NMOS transistor M2 is electrically connected to an input terminal 2in− of a low potential side (− side) of the operational amplifier 2 described later.

A gate electrode M3g functioning as a first electrode of the third NMOS transistor M3 is electrically connected to an output terminal 2out of the operational amplifier. The source electrode M3s of the third NMOS transistor M3 is electrically connected to the low-potential input terminal 2in− of the operational amplifier 2. In addition, the source electrode M3s of the third NMOS transistor M3 is electrically connected to the drain electrode M2d of the second NMOS transistor M2, as described above. A drain electrode M3d functioning as a third electrode of the third NMOS transistor M3 is set as an output terminal. A voltage value outputted from the drain electrode M3d of the third NMOS transistor M3 is set as Vout, as depicted in FIG. 1.

The high-potential input terminal 2in+ of the operational amplifier 2 is electrically connected to power supply potential Vdd used as a third potential. As described above, the high-potential input terminal 2in+ of the operational amplifier 2 is electrically connected to the drain electrode M1d of the first NMOS transistor M1. Moreover, the low-potential input terminal 2in− of the operational amplifier 2 is electrically connected to the drain electrode M2d of the second NMOS transistor M2 and the source electrode M3s of the third NMOS transistor M3, as described before. The output terminal 2out of the operational amplifier 2 is electrically connected to the gate electrode M3g of the third NMOS transistor M3, as described before. FIG. 2 is a circuit diagram showing the detailed configuration of the operational amplifier 2. In this case, the operational amplifier functions as a control circuit. The control circuits controls the voltage value of the gate electrode M3g of the third NMOS transistor M3 so that voltage values of drain electrodes M1d and M2d of first and second NMOS transistors M1 and M2 becomes equal to each other.

As described above, both gate electrodes M1g and M2g of first and second NMOS transistors M1 and M2 are electrically connected to reference potential Vref. In this case, the reference potential Vref is a voltage in which the gate electrode M1g of the first NMOS transistor M1 and the second NMOS transistor M2 are operating in a linear area. By doing so, the first and second NMOS transistors M1 and M2 are both operated in a linear area. Moreover, the operation amplifier 2 sets a drain-source voltage Vds1 of the first NMOS transistor M1 to the approximately same value as a drain-source voltage Vds2 of the second NMOS transistor M2. The third NMOS transistor M3 is provided as a cascade (cascode) element. By doing so, it is possible to reduce an error between input-output currents resulting from channel length modulation effect. In addition, the reference potential Vref is set to a very higher value such as about 2.5 V than conventionally. By doing so, first and second NMOS transistors M1 and M2 are both operated in a deeply linear area.

As shown in FIG. 1, a connection node of the high-potential input terminal 2in+ of the operational amplifier 2 with the drain electrode M1d of the first NMOS transistor M1 is set as X1. Moreover, a connection node of the low-potential input terminal 2in− of the operational amplifier 2 with the drain electrode M2d of the second NMOS transistor M2 and the source electrode M3s of the third NMOS transistor M3 is set as Y1. In the current mirror circuit 1 having the foregoing configuration, the operation amplifier 2 and the third NMOS transistor M3 are operated so that voltage $V_{X1}$ at the X1 and voltage $V_{Y1}$ at the Y1 are set to an approximately equal value. Thus, an output current Iout is variable in accordance with a reference current Iref. For example, if the foregoing voltage $V_{X1}$ at the X1 and voltage $V_{Y1}$ at the Y1 becomes nearly equal voltage value, the output current Iout becomes approximately equal to the reference current Iref. Therefore, voltage $V_{X1}$ and voltage $V_{Y1}$ becomes approximately same in a range where the output voltage Vout of the current mirror circuit 1 is about 0.18 V or more, as seen from FIG. 3. Moreover, output voltage VZ1 of the operational amplifier 2 is stable when the output voltage Vout of the current mirror circuit 1 is about 0.45 V or more.

In the current mirror circuit 1 having the foregoing configuration, the width of a linear area shown by L1 of FIG. 4 becomes very narrow as seen from a graph of FIG. 4. Specifically, the linear area shown by L1 becomes very narrow in a range from 0 V to about 0.14 V converted into the output voltage Vout of the current mirror circuit 1. In other words, the minimum allowable voltage of the current mirror circuit 1 is set considerably lower than the conventional current mirror circuit.

Figure 5:
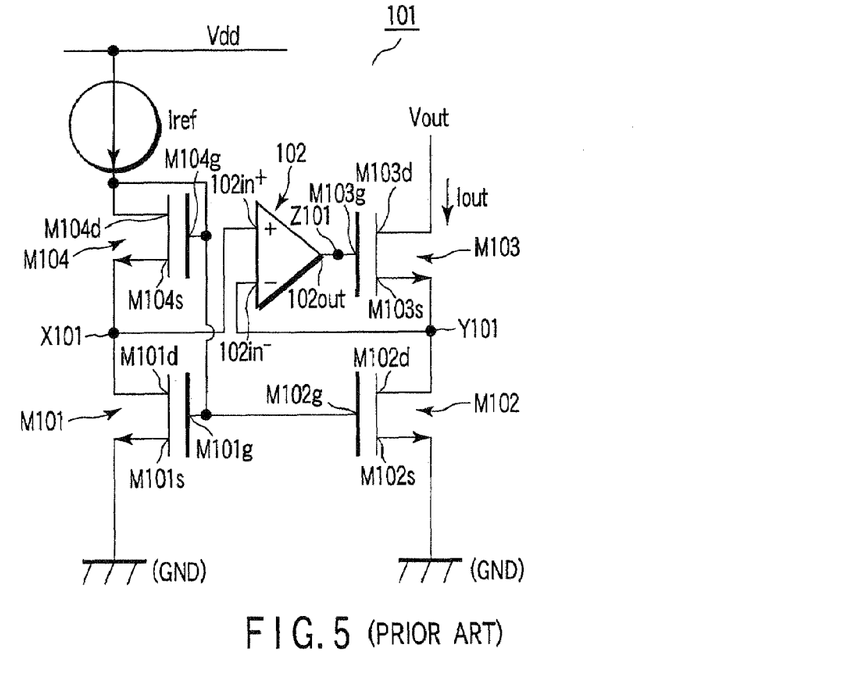
FIG. 5 is a circuit diagram showing the configuration of a current mirror circuit according to the prior art given as a comparative example relevant to the first embodiment.

A current mirror circuit according to the prior art given as a comparative example with respect to this embodiment and its operating state will be briefly explained below with reference to FIG. 5 to FIG. 7. FIG. 5 is a circuit diagram showing the configuration of a current mirror circuit according to the prior art given as a comparative example with respect to this embodiment. The current mirror circuit is disclosed in the following document.

Document: O. Charlon, W. Redman-White, "UltraHigh-Compliance CMOS Current Mirrors for Low Voltage Charge Pumps and References", Proc. Of ESSCIRC 04, pp. 227-230, Leuven (September 2004)

Figure 6:
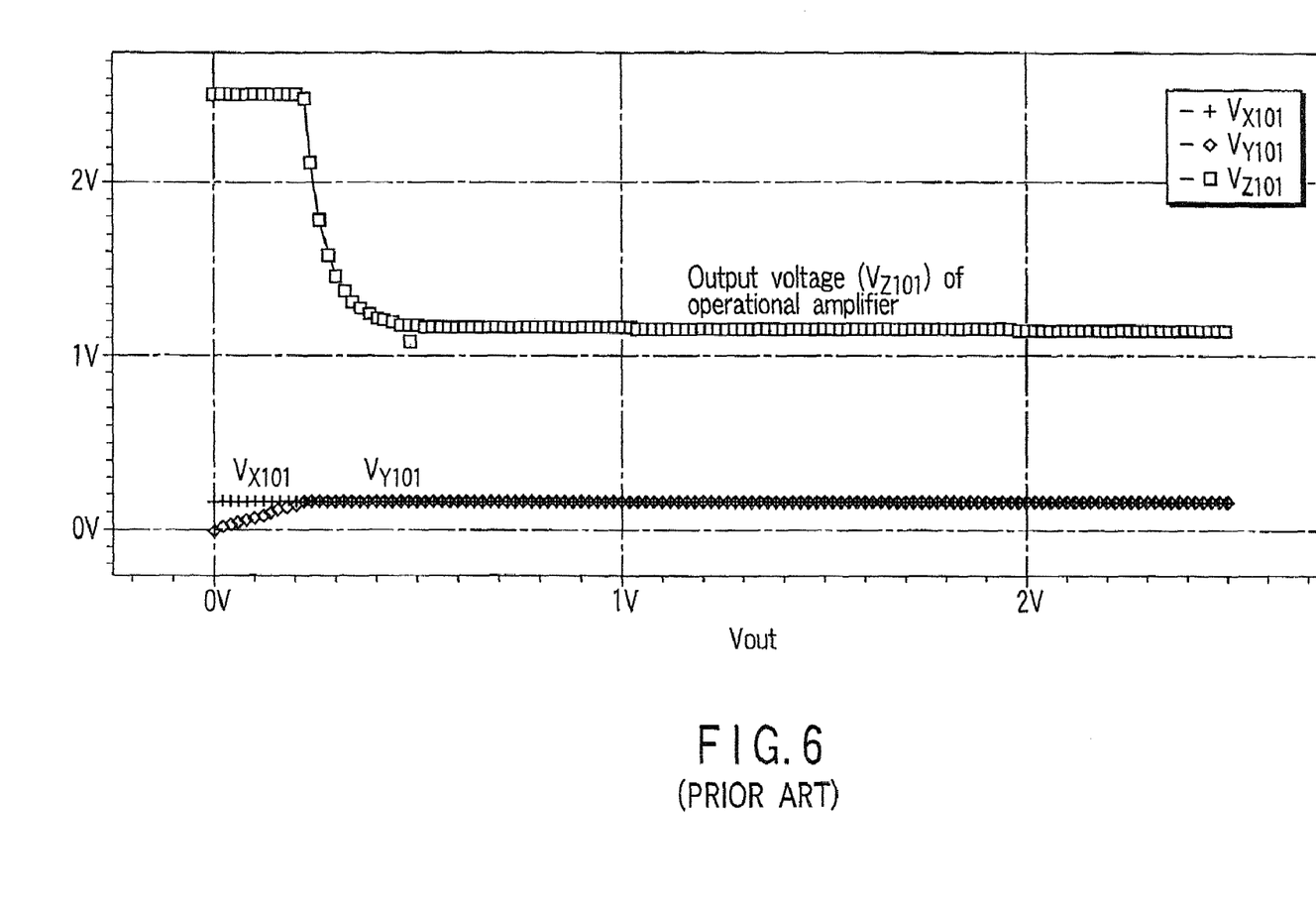
FIG. 6 is a graph showing voltage values XP, YP and ZP shown in FIG. 5.

FIG. 6 is a graph showing voltage values at XP, YP and ZP shown in FIG. 5. FIG. 7 is a graph showing output current characteristic with respect to output voltage of the current mirror circuit shown in FIG. 5.

A current mirror circuit 101 shown in FIG. 5 is called as a high compliance regulated cascade (cascode) current mirror circuit. The current mirror circuit 101 is one of current mirror circuits having the minimum allowable voltage, which has been conventionally reduced most. The current mirror circuit 101 has the following settings to operate first and second transistors M101 and M102 in a linear area. According to the settings, individual gate-source voltages of first and second transistors M101 and M102 are set to the approximately equal value in addition to individual drain-source voltages thereof. In this case, four, that is, first to fourth transistors included in the current mirror circuit 101 are all NMOS transistors.

According to the circuit configuration shown in FIG. 5, the gate voltage of the first transistor M101 is substantially equal to the gate voltage of the second transistor M102. Here, a connection node of a high-potential input terminal 102hin of an operational amplifier 102 with a gate electrode M101g of the first NMOS transistor M101 is set as X101. Moreover, a connection node of a low-potential input terminal 102lin of an operational amplifier 102 with a drain electrode M102d of the second NMOS transistor M102 and a source electrode M103s of the third NMOS transistor M103 is set as Y101. As seen from FIG. 5, a fourth transistor M104 is interposed between power supply potential Vdd and a drain electrode M101d of the first transistor M101. By doing so, a voltage $V_{X101}$ of the node X101 steps down. As a result, the first NMOS transistor M101 is operated in a linear area. Drain voltage of first and second transistors M101 and M102 becomes nearly equal via the operational amplifier 102. As a result, the second NMOS transistor M102 is operated in a linear area in addition to the first NMOS transistor M101. In other words, the minimum allowable voltage of the current mirror circuit is set lower.

However, in the current mirror circuit 101, voltage $V_{X101}$ and $V_{Y101}$ does not become the same if the output voltage Vout is not about 0.22 V or more, as seen from FIG. 6. Moreover, if the output voltage Vout of the current mirror circuit 101 is not about 0.5 V or more, an output voltage VZ101 of the operational amplifier 102 is not stable.

Figure 7:
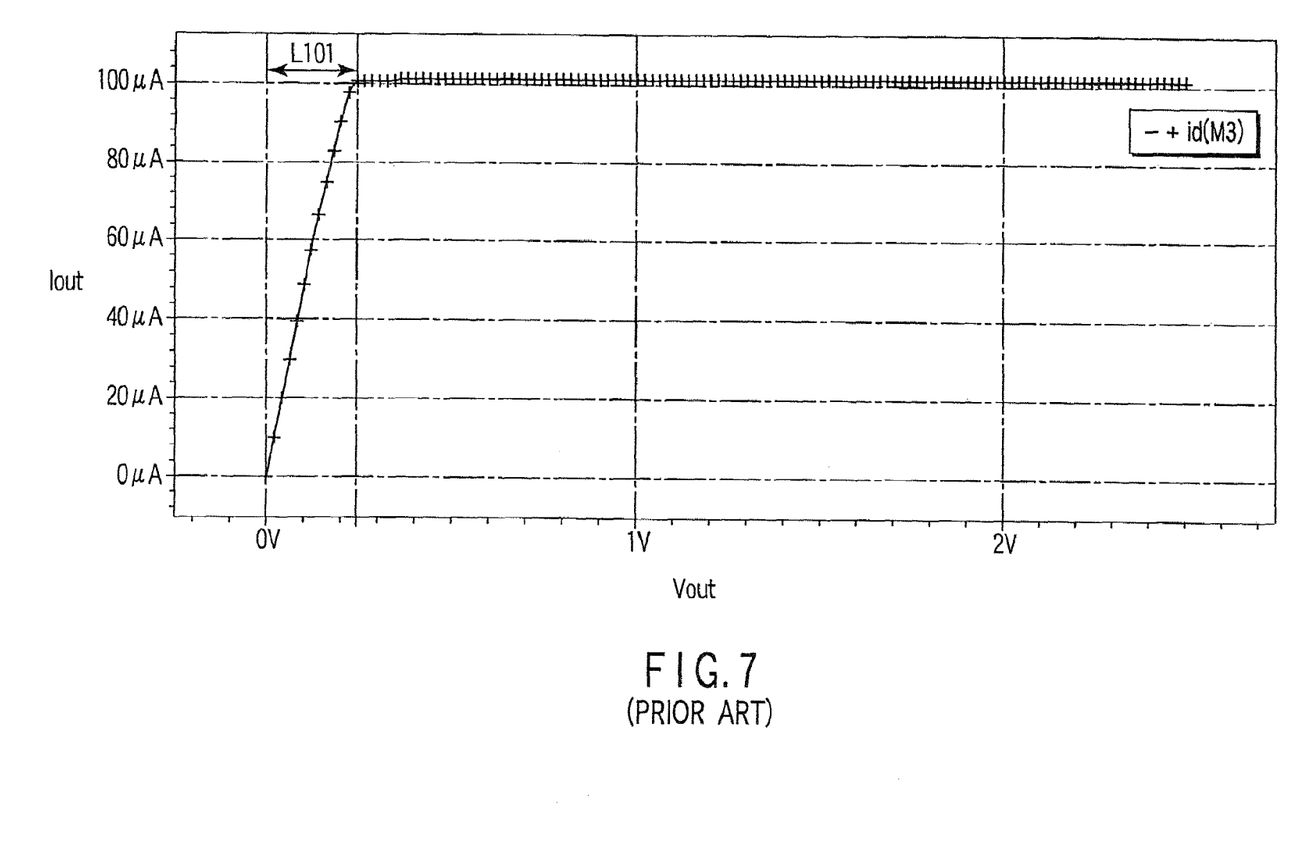
FIG. 7 is a graph showing output current characteristic with respect to output voltage of the current mirror circuit shown in FIG. 5.

As depicted in FIG. 7, the width of a linear area shown by L101 of FIG. 7 is given in a range from 0 V to about 0.25 V converted into the output voltage Vout of the current mirror circuit 1. In other words, the minimum allowable voltage of the current mirror circuit 101 becomes about 0.11 V higher than that of the current mirror circuit 1 of this embodiment.

In the current mirror circuit 1 of the first embodiment, gate voltage higher than the conventional case is applied to gate electrodes M1g and M2g of first and second NMOS transistors M1 and M2. Thus, the first and second NMOS transistors M1 and M2 are operated in a deeply linear area; therefore, the minimum allowable voltage of the output voltage is set lower. In other words, the current mirror circuit 1 is operated at a voltage lower than the conventional current mirror circuit; therefore, power saving is achieved. As a result, the current mirror circuit 1 is built in various small-sized (portable) electronic apparatus powered using cell or small-size battery. By doing so, the foregoing small-sized electronic apparatus is stably used even if the operating voltage is set to a lower voltage value. This serves to make long the operating time of the small-sized electronic apparatus having a built-in current mirror circuit. Moreover, this serves to reduce an error between input-output current resulting from channel length modulation effect between first and second NMOS transistors M1 and M2.

Second Embodiment

Figure 8:
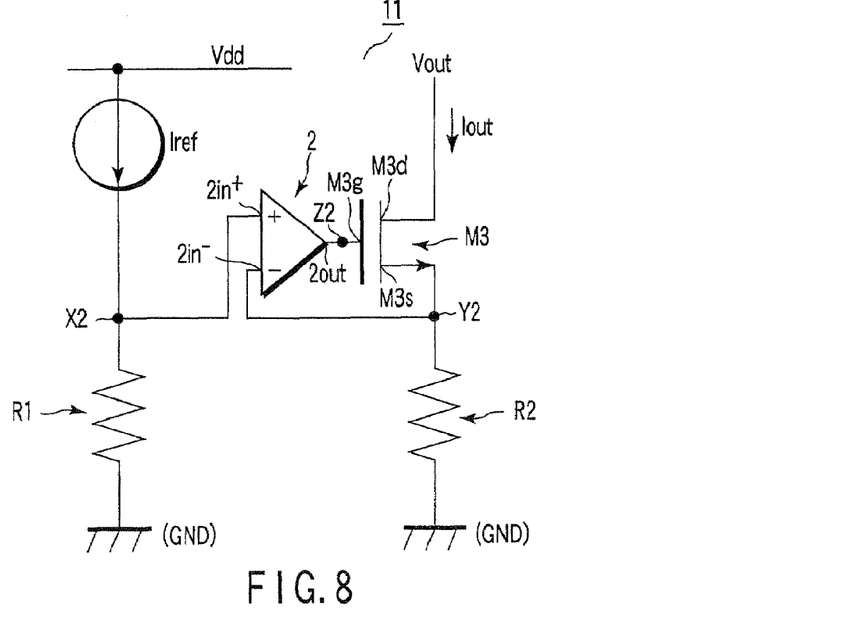
FIG. 8 is a circuit diagram showing the configuration of a current mirror circuit according to a second embodiment of the present invention.
Figure 9:
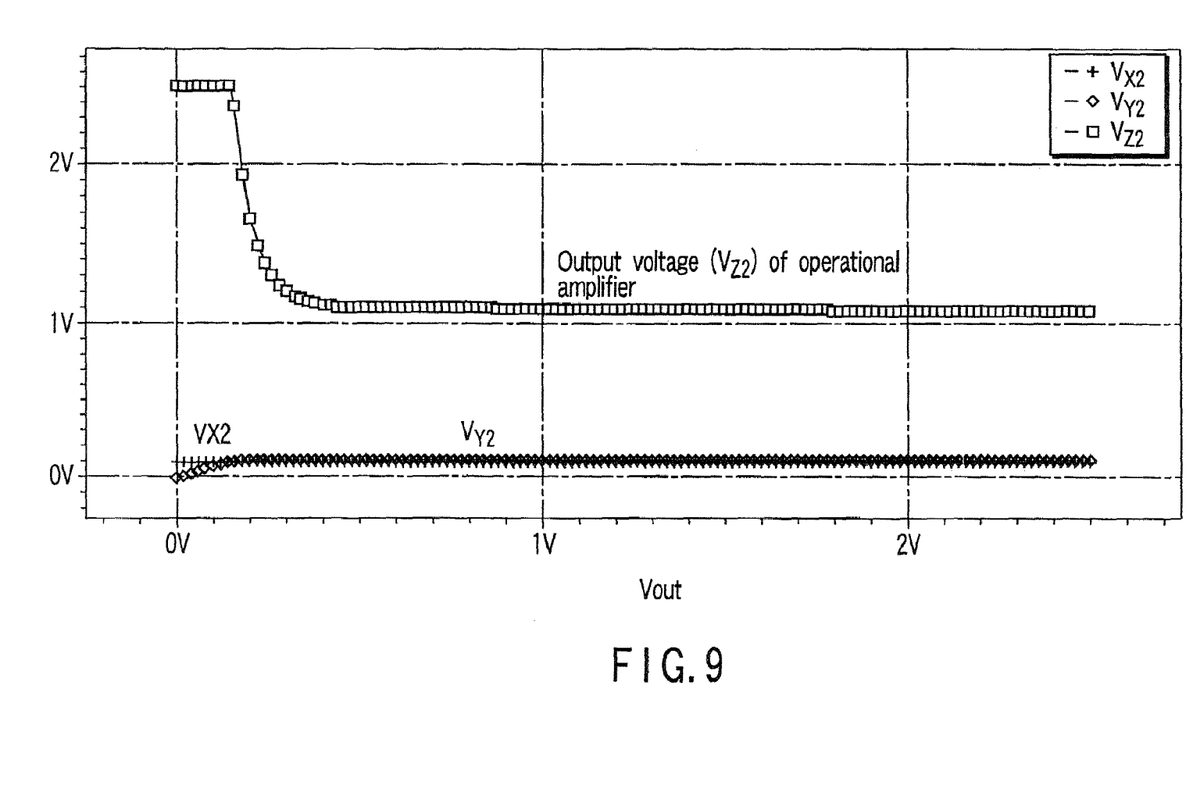
FIG. 9 is a graph showing voltage values X2, Y2 and Z2 shown in FIG. 8.
Figure 10:
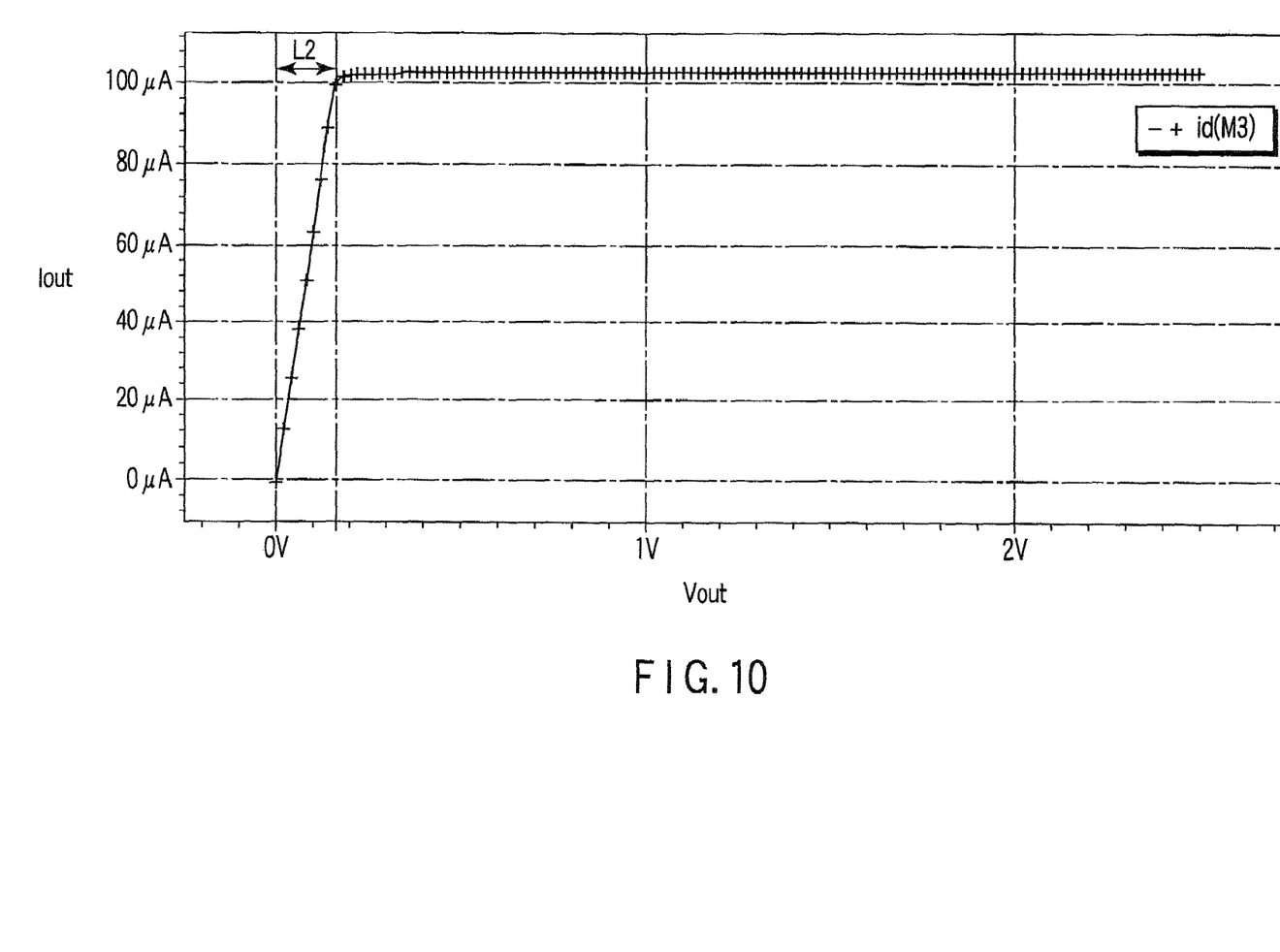
FIG. 10 is a graph showing output current characteristic with respect to output voltage of the current mirror circuit shown in FIG. 8.

The second embodiment of the present invention will be explained below with reference to FIG. 8 to FIG. 10. FIG. 8 is a circuit diagram showing the configuration of a current mirror circuit according to a second embodiment of the present invention. FIG. 9 is a graph showing voltage values X2, Y2 and Z2 shown in FIG. 8. FIG. 10 is a graph showing output current characteristic with respect to output voltage of the current mirror circuit shown in FIG. 8. The same reference numerals are used to designate components identical to the foregoing first embodiment, and the details are omitted.

According to the second embodiment, a current mirror circuit 11 has the following circuit configuration. Specifically, one of linear elements, that is, resistance elements (resistor) are used in place of first and second NMOS transistors included in the current mirror circuit 1 of the foregoing first. The circuit configuration will be explained below in detail.

As shown in FIG. 8, the current mirror circuit 11 of the second embodiment is composed of two, that is, first and second resistance elements R1, R2, transistor M3 and one operational amplifier 2. The transistors M3 is the same as the third NMOS transistor M3 included in the current mirror circuit 1 of the foregoing first embodiment. Thus, the transistor M3 calls third NMOS transistor M3 in the following description.

One terminal of the first resistance element R1 is electrically connected to power supply potential Vdd used as a first potential. In addition, one terminal of the first resistance element R1 is electrically connected to a high-potential input terminal 2in+ of the operational amplifier 2. The other terminal of the first resistance element R1 is electrically connected to a second potential lower than the first potential. Specifically, the other terminal of the first resistance element R1 is grounded.

One terminal of the second resistance element R2 is electrically connected to a low-potential input terminal 2in− of the operational amplifier 2. In addition, one terminal of the second resistance element R2 is electrically connected to a source electrode M3s of the third NMOS transistor M3. The other terminal of the first resistance element R1 is electrically connected to a second potential lower than the first potential. The other terminal of the second resistance element R2 is grounded like the other terminal of the first resistance element R1.

A gate electrode M3g of functioning as a first electrode of the third NMOS transistor M3 is electrically connected to an output terminal 2out of the operational amplifier 2. A source electrode M3s of functioning as a second electrode of the third NMOS transistor M3 is electrically connected to a low-potential input terminal 2in− of the operational amplifier 2. In addition, the source electrode M3s of the third NMOS transistor M3 is electrically connected to one terminal of the second resistance element. A drain electrode M3d functioning as a third electrode of the third NMOS transistor M3 is set as an output terminal.

A high-potential input terminal 2in+ of the operational amplifier 2 is electrically connected to power supply potential Vdd used as a first potential. In addition, the high-potential input terminal 2in+ of the operational amplifier 2 is electrically connected to one terminal of the first resistance element, as described before. Moreover, the low-potential input terminal 2in− of the operational amplifier 2 is electrically connected to one terminal of the first resistance element and the source electrode M3s of the third NMOS transistor M3, as described above. The output terminal 2out of the operational amplifier is electrically connected to the gate electrode M3g of the third NMOS transistor.

In the second embodiment, each resistance of the first and second resistance elements R1 and R2 is set to the same value. For example, each resistance of the first and second resistance elements R1 and R2 is set to about 1 kΩ. Incidentally, it is preferable that each resistance value of the first and second resistance elements R1 and R2 is set smaller. However, if the resistance value is too small, about 1 kΩ is preferable because the gradient (inclination) becomes large in a saturation area. Moreover, the operational amplifier 2 set voltage across the first resistance element R1 and voltage across the second resistance element R2 to the same value. As depicted in FIG. 8, a connection node of the high-potential input terminal 2in+ of the operational amplifier 2 with one terminal of the first resistance element R1 is set as X2. Moreover, a connection node of the low-potential input terminal 2in− of the operational amplifier 2 with one terminal of the second resistance element and the source electrode M3s of the third NMOS transistor M3 is set as Y2.

In the current mirror circuit 11 having the foregoing configuration, voltage $V_{X2}$ at the node X2 and voltage $V_{Y2}$ at the node Y2 are set to the same value. By doing so, a reference current Iref becomes approximately equal to an output current Iout. As shown in FIG. 9, when the output voltage Vout of the current mirror circuit 11 becomes about 0.18 V or more, voltages $V_{X2}$ and $V_{Y2}$ becomes nearly the same, like the current mirror circuit 1 of the first embodiment. Moreover, when the output voltage Vout of the current mirror circuit 11 becomes about 0.45 V or more, an output voltage $V_{Z2}$ of the operational amplifier 2 is stable, like the current mirror circuit 1 of the first embodiment.

In the current mirror circuit 11 having the foregoing configuration, the width of a linear area shown by L2 of FIG. 10 becomes narrow as seen from FIG. 10, like the current mirror circuit 1 of the first embodiment. Specifically, the width of a linear area shown by L2 of FIG. 10 is given over a range from 0 V to about 0.18 converted into the output voltage Vout of the current mirror circuit 11. In other words, the minimum allowable voltage of the current mirror circuit 11 is set considerably lower than the conventional current mirror circuit. Moreover, the current mirror circuit 11 of the second embodiment has a current copy accuracy improved in a saturation area as compared with the current mirror circuit 1 of the first embodiment, as seen from FIG. 10.

As described above, the current mirror circuit 11 of the second embodiment has the following circuit configuration. Specifically, one of linear elements, that is, first and second resistance elements R1 and R2 are used in place of first and second NMOS transistors M1 an M2 used for the linear area in the current mirror circuit 1 of the first embodiment. Even if these resistance elements R1 and R2 are used, the same effect as the current mirror circuit 1 of the first embodiment is obtained. Moreover, the foregoing first and second resistance elements R1 and R2 are used in place of first and second NMOS transistors M1 an M2 included in the current mirror circuit 1 of the first embodiment. By doing so, no error occurs between input-output current resulting from channel length modulation effect. In addition, the current mirror circuit 11 of the second embodiment has a current copy accuracy improved in a saturation area as compared with the current mirror circuit 1 of the first embodiment.

Third Embodiment

Figure 11:
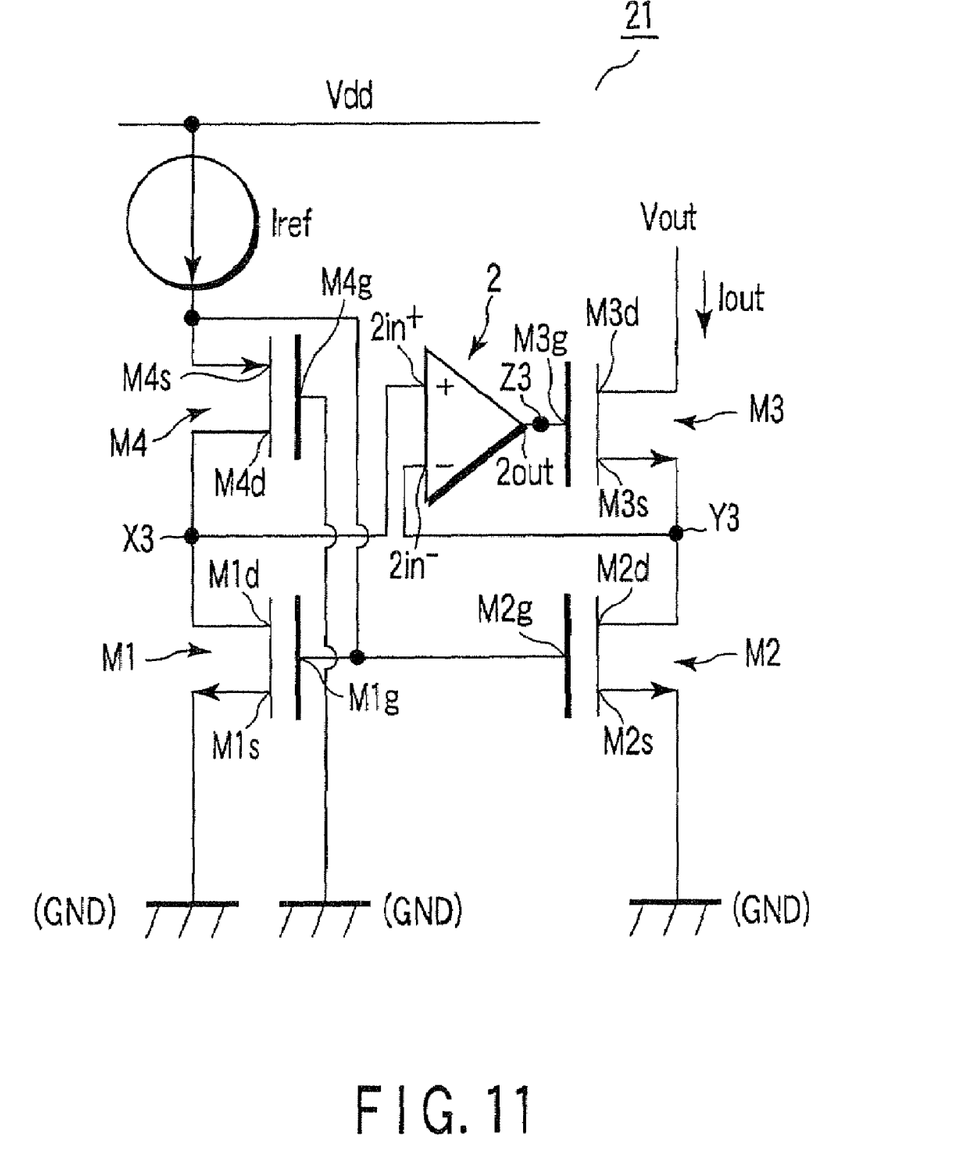
FIG. 11 is a circuit diagram showing the configuration of a current mirror circuit according to a third embodiment of the present invention.
Figure 12:
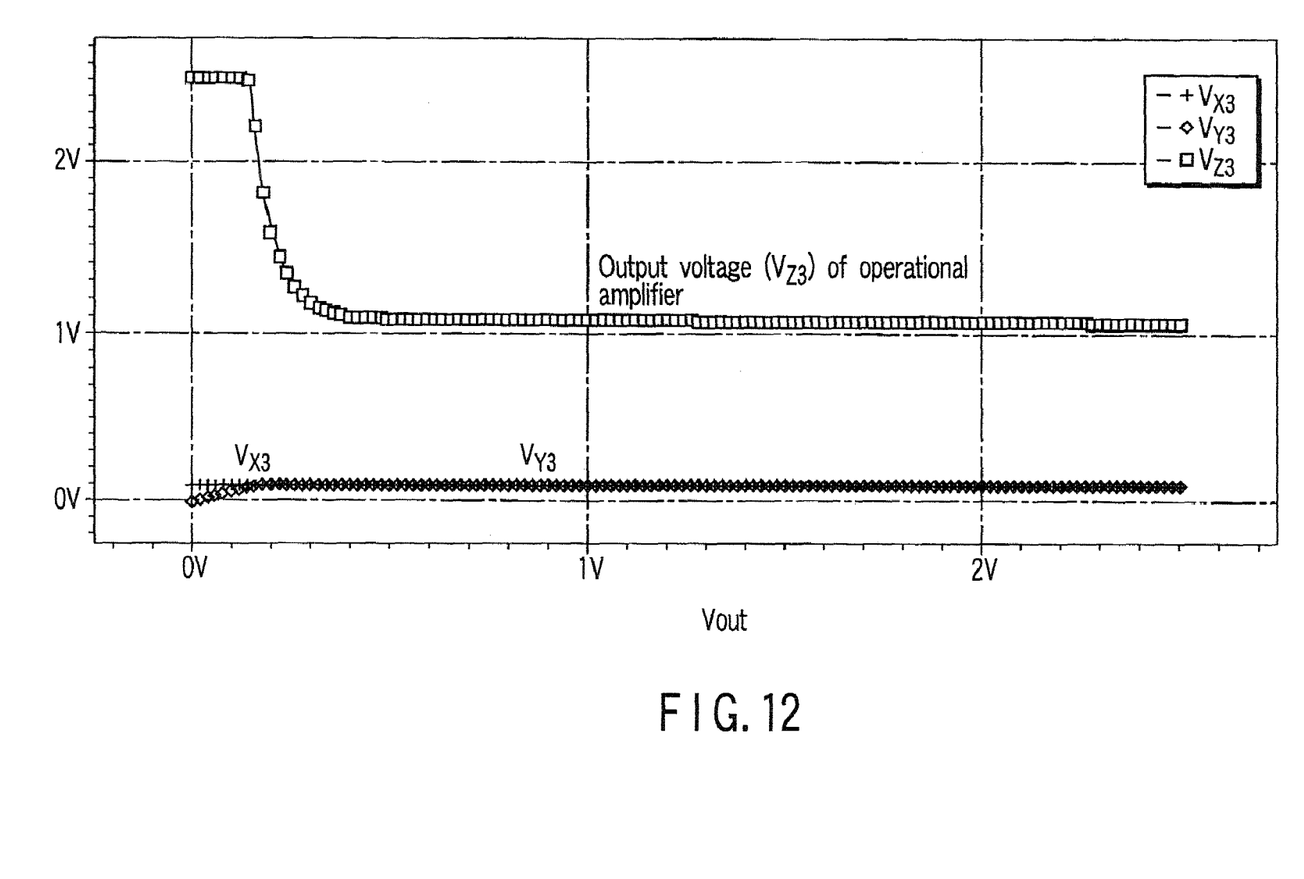
FIG. 12 is a graph showing voltage values X3, Y3 and Z3 shown in FIG. 11.
Figure 13:
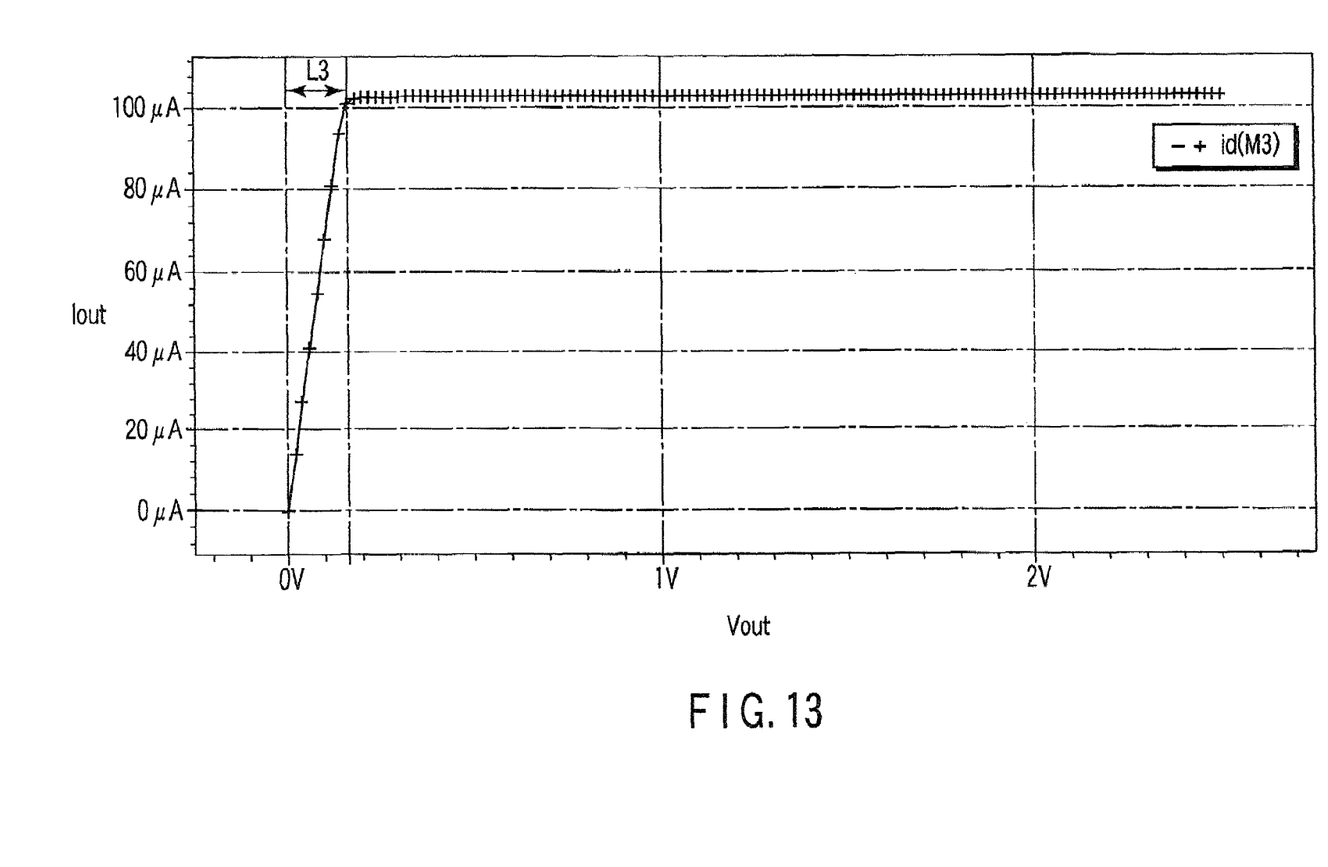
FIG. 13 is a graph showing output current characteristic with respect to output voltage of the current mirror circuit shown in FIG. 11.

The third embodiment of the present invention will be explained below with reference to FIG. 11 to FIG. 13. FIG. 11 is a circuit diagram showing the configuration of a current mirror circuit according to a third embodiment of the present invention. FIG. 12 is a graph showing voltage values X3, Y3 and Z3 shown in FIG. 11. FIG. 13 is a graph showing output current characteristic with respect to output voltage of the current mirror circuit shown in FIG. 11. The same reference numerals are used to designate components identical to the foregoing first and second embodiments, and the details are omitted.

According to the third embodiment, a current mirror circuit has the following circuit configuration. Specifically, a fourth transistor M4 is further provided in addition to the first to third NMOS transistors M1 to M3 included in the current mirror circuit 1 of the first embodiment. The circuit configuration will be explained below in detail.

As shown in FIG. 11, A current mirror circuit 21 of the third embodiment is composed of four, that is, first to fourth transistors M1 to M4 and one operational amplifier 2. In this case, the fourth transistor M4 is a PMOS transistor; on the other hand, other first to third transistors M1 to M3 are NMOS transistors.

A gate electrode M1g functioning as a first electrode of the first NMOS transistor M1 is electrically connected to power supply potential Vdd used as a first potential. In addition, the gate electrode M1g of the first NMOS transistor M1 is electrically connected to a source electrode M4s functioning as a second electrode of the fourth PMOS transistor M4 described later. A source electrode M1s functioning as a second electrode of the first NMOS transistor M1 is electrically connected to a second potential lower than the first potential. Specifically, the source electrode M1s of the first NMOS transistor M1 is grounded. A drain electrode M1d functioning as a third electrode of the first NMOS transistor M1 is electrically connected to a high-potential input terminal 2in+ of the operational amplifier 2. In addition, the drain electrode M1d of the first NMOS transistor M1 is electrically connected to a drain electrode M4d functioning as a third electrode of the fourth PMOS transistor M4 described later.

A gate electrode M2g functioning as a first electrode of the second NMOS transistor M2 is electrically connected to power supply potential Vdd used as a first potential. In addition, the gate electrode M2g of the second NMOS transistor M2 is electrically connected to the gate electrode M1g of the first NMOS transistor M1. Further, the gate electrode M2g of the second NMOS transistor M2 is electrically connected to a source electrode M4s functioning as a second electrode of the fourth PMOS transistor M4 described later. The source electrode M2s functioning as a second electrode of the second NMOS transistor M2 is electrically connected to a second potential lower than the first potential. Specifically, the source electrode M2s of the second NMOS transistor M2 is grounded. A drain electrode M2d functioning as a third electrode of the second NMOS transistor M2 is electrically connected to a low-potential input terminal 2in− of the operational amplifier 2. In addition, the drain electrode M2d of the second NMOS transistor M2 is electrically connected to a source electrode M3s functioning as a second electrode of the third NMOS transistor M3.

A gate electrode M3g functioning as a first electrode of the third NMOS transistor M3 is electrically connected to an output terminal 2out of the operational amplifier 2. The source electrode M3s functioning as a second electrode of the third NMOS transistor M3 is electrically connected to an input terminal 2in− of the operational amplifier. In addition, the source electrode M3s of the third NMOS transistor M3 is electrically connected to the drain electrode M2d of the second NMOS transistor M2, as described above. A drain electrode M3d functioning as a third electrode of the third NMOS transistor M3 is set as an output terminal.

A gate electrode M4g functioning as a first electrode of the fourth PMOS transistor M4 is electrically connected to a second potential. Specifically, the gate electrode M4g of the fourth PMOS transistor M4 is grounded. The source electrode M4s functioning as a second electrode of the fourth PMOS transistor M4 is electrically connected to power supply potential Vdd used as a first potential. In addition, the source electrode M4s of the fourth PMOS transistor M4 is electrically connected to gate electrodes M1g and M2g of first and second NMOS transistors M1 and M2, as described before. A drain electrode M4d functioning as a third electrode of the fourth PMOS transistor M4 is electrically connected to an high-potential input terminal 2in+ of the operational amplifier 2. In addition, the drain electrode M4d of the PMOS transistor M4 is electrically connected to the drain electrode M1d of the first NMOS transistor M1, as described above.

The high-potential input terminal 2in+ of the operational amplifier 2 is electrically connected to drain electrodes M1d and M4d of first NMOS transistor M1 and fourth PMOS transistor M4. The low-potential input terminal 2in− of the operational amplifier 2 is electrically connected to the drain electrode M2d of the second NMOS transistor M2 and the source electrode M3s of the third NMOS transistor M3. The output terminal 2out of the operational amplifier is electrically connected to the gate electrode M3g of the third NMOS transistor M3.

As described above, gate electrodes M1g and M2g of first and second NMOS transistor M1 and M2 are both electrically connected to power supply potential Vdd. By doing so, the first and second transistor M1 and M2 are both operated in a linear area. Moreover, the operational amplifier 2 and the third NMOS transistor M3 set a drain-source voltage Vds1 of the first NMOS transistor M1 to the same value as a drain-source voltage Vds2 of the second NMOS transistor M2. In addition, the third NMOS transistor M3 is provided as a cascade (cascade) element. By doing so, it is possible to prevent an error between input-output current resulting from channel length modulation effect.

As depicted in FIG. 11, a connection node of the high-potential input terminal 2in+ of the operational amplifier 2 with the gate electrode M1g of first and second NMOS transistor M1 and the drain electrode M4d of the PMOS transistor M4 is set as X3. In addition, a connection node of the low-potential input terminal 2in− of the operational amplifier 2 with the drain electrodes M2d of the second NMOS transistor M2 and the source electrode M3s of the third NMOS transistor M3 is set as Y3. In the current mirror circuit 21 having the foregoing configuration, a voltage $V_{X3}$ at the node X3 and a voltage $V_{Y3}$ at the node Y3 becomes approximately equal voltage value. By doing so, a reference current Iref becomes nearly equal to an output current Iout. As seen from FIG. 12, voltages $V_{X3}$ and $V_{Y3}$ becomes the approximately same value when the output voltage Vout of the current mirror circuit 21 becomes about 0.18 V or more like current mirror circuits 1 and 11 of first and second embodiments. Moreover, an output voltage $V_{Z3}$ of the operational amplifier is stable when the output voltage Vout of the current mirror circuit 21 becomes about 0.45 V or more like current mirror circuits 1 and 11 of first and second embodiments.

In the current mirror circuit 21 having the foregoing configuration, the width of a linear area shown by L3 of FIG. 13 becomes very narrow as seen from a graph of FIG. 13, as compared with current mirror circuits 1 and 11 of first and second embodiments. Specifically, the linear area shown by L3 becomes very narrow in a range from 0 V to about 0.18 V converted into the output voltage Vout of the current mirror circuit 21. In other words, the minimum allowable voltage of the current mirror circuit 21 is set considerably lower than the conventional current mirror circuit. Moreover, as seen from FIG. 13, the current mirror circuit 21 has current copy accuracy improved in a saturation area like the current mirror circuit 11 of the second embodiment, as compared with the current mirror circuit 1 of the first embodiment.

As descried above, according to the third embodiment, the same effect as the first and second embodiments is obtained. The fourth transistor M4 is interposed between the power supply potential Vdd and the drain electrode M1d of the first NMOS transistor M1. By doing so, the potential at the node X3 is reduced. In particular, the fourth transistor M4 is used, and the gate voltage is set as ground potential (GND). By doing so, it is possible to set the minimum allowable voltage lower than the comparative example of the first embodiment, that is, the conventional current mirror circuit 101 using the fourth transistor M4 comprising a NMOS transistor.

The current mirror circuit of the present invention is not limited to the foregoing first to third embodiments. Part of these configurations and settings may be variously changed, or various settings may be properly combined.

For example, the first to third transistors M1 to M3 may be composed of PMOS, and not NMOS, and the operational amplifier may be composed of a differential couple of PMOS transistor. In this case, the potential of each electrode of the first to third transistors M1 to M3 is properly set, and thereby, the same effect as the current mirror circuits 1, 11 and 21 of the first to third embodiments is obtained. Moreover, the first to fourth transistors M1 to M4 may be composed of bipolar transistor in place of MOSFET, in addition to the third transistor used as cascade (cascode) element.

Operational amplifier, digital/analog converter (DAC) and portable various small-sized electronic apparatus may be configured using the current mirror circuits 1, 11 and 21 of the first to third embodiments as a current source. The foregoing current mirror circuits 1, 11 and 21 each have the minimum allowable voltage, which is low, and operated at low voltage; therefore, very long operating time is provided. As a result, operational amplifier, digital/analog converter (DAC) using the current mirror circuits 1, 11 and 21 as a current source are stably operated. Thus, this serves to achieve power saving, low energy and high performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A current mirror circuit comprising:
a first resistance element having one terminal connected to a first potential and the other terminal connected to a second potential lower than the first potential;
an operational amplifier having a high-potential input terminal connected to the first potential and the one terminal of the first resistance element;
a second resistance element having one terminal connected to a low-potential input terminal of the operational amplifier and the other terminal connected to the second potential; and
a transistor having a first electrode connected to an output terminal of the operational amplifier, a second electrode connected to the low-potential input terminal of the operational amplifier and the one terminal of the second resistance element, and a third electrode used as an output terminal;
wherein a potential of a connection node of the high-potential input terminal of the operational amplifier with said one terminal of the first resistance element is set to a value equal to a potential of a connection node of the low-potential input terminal of the operational amplifier with said one terminal of the second resistance element and the second electrode of the transistor;
wherein the first resistance element and the second resistance element both start to operate from a linear area having lower voltage than a saturation area.

2. The circuit according to claim 1, wherein the transistor is an NMOS transistor.

3. The circuit according to claim 1, wherein the transistor is a PMOS transistor.

4. The circuit according to claim 1, wherein the first to third electrodes are gate, source, and drain electrodes, respectively.

5. The circuit according to claim 1, wherein the first and second resistance elements have a resistance value equal to each other.

6. The circuit according to claim 1, wherein each resistance value of the first and second resistance elements is 1 kΩ.

7. The circuit according to claim 1, wherein the first potential is a power supply potential and the second potential is a ground potential.

8. The circuit according to claim 1, wherein the operational amplifier controls a voltage value of the first electrode of the transistor to equalize a voltage value across the first resistance element to a voltage value across the second resistance element.

* * * * *